(12) United States Patent
Yamagata et al.

(10) Patent No.: US 7,075,474 B2
(45) Date of Patent: Jul. 11, 2006

(54) RAMP WAVEFORM GENERATION CIRCUIT, ANALOG/DIGITAL CONVERSION CIRCUIT, IMAGING DEVICE AND CONTROL METHOD OF IMAGING DEVICE

(75) Inventors: Seiji Yamagata, Kawasaki (JP); Jun Funakoshi, Kawasaki (JP); Tsuyoshi Higuchi, Kawasaki (JP); Toshitaka Mizuguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/998,728

(22) Filed: Nov. 30, 2004

(65) Prior Publication Data
US 2006/0001564 A1    Jan. 5, 2006

(30) Foreign Application Priority Data
Jul. 2, 2004    (JP) .............................. 2004-197330

(51) Int. Cl.
*H03M 1/56* (2006.01)
(52) U.S. Cl. ...................... 341/169; 341/155; 348/241; 348/308
(58) Field of Classification Search ................ 341/169; 348/308
See application file for complete search history.

(56) References Cited

U.S. PATENT DOCUMENTS

| 5,877,715 | A | * | 3/1999 | Gowda et al. .............. 341/122 |
| 5,982,318 | A | * | 11/1999 | Yiannoulos ................. 341/155 |
| 6,137,432 | A | * | 10/2000 | Xiao ........................... 341/169 |
| 6,423,957 | B1 | * | 7/2002 | Kim et al. ................. 250/208.1 |
| 6,545,624 | B1 | * | 4/2003 | Lee et al. .................... 341/155 |
| 6,633,335 | B1 | * | 10/2003 | Kwon et al. ................ 348/308 |
| 6,727,486 | B1 | * | 4/2004 | Choi ....................... 250/208.1 |
| 2004/0021787 | A1 | * | 2/2004 | Cho ........................... 348/308 |

FOREIGN PATENT DOCUMENTS

| JP | 04-048812 | 2/1992 |
| JP | 11-332222 | 11/1999 |

* cited by examiner

*Primary Examiner*—Rexford Barnie
*Assistant Examiner*—Khai M. Nguyen
(74) *Attorney, Agent, or Firm*—Arent Fox PLLC

(57) ABSTRACT

A ramp waveform generation circuit which comprises a first reference power supply, and supplies a ramp waveform signal to an analog/digital conversion circuit further comprises a connection circuit for reflecting the amount of fluctuation of the output potential of a second reference power supply which is installed in a noise elimination circuit for eliminating the noise of an analog signal inputted to the analog/digital conversion circuit in the output potential of the first reference power supply.

18 Claims, 3 Drawing Sheets

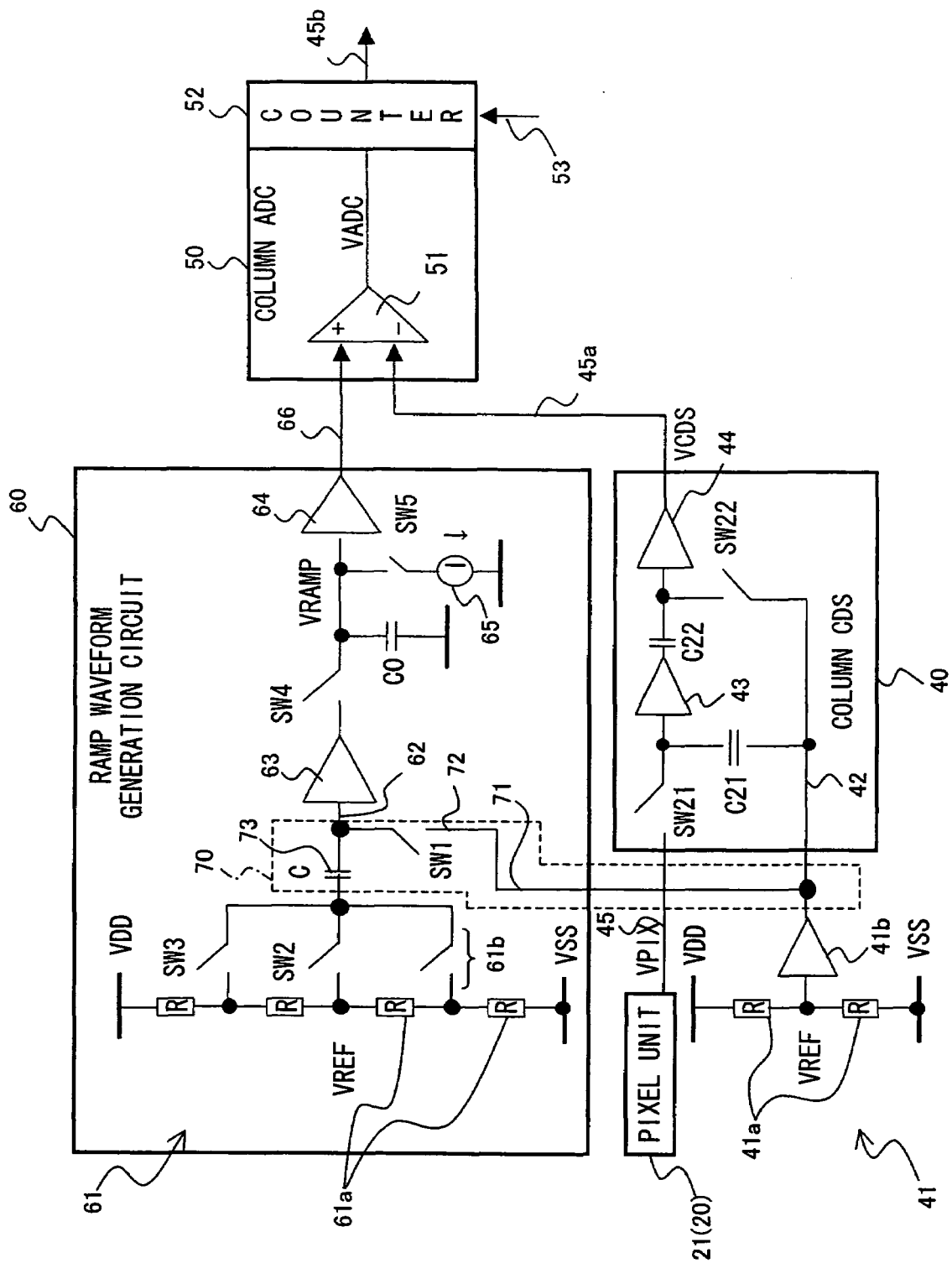
F I G. 1

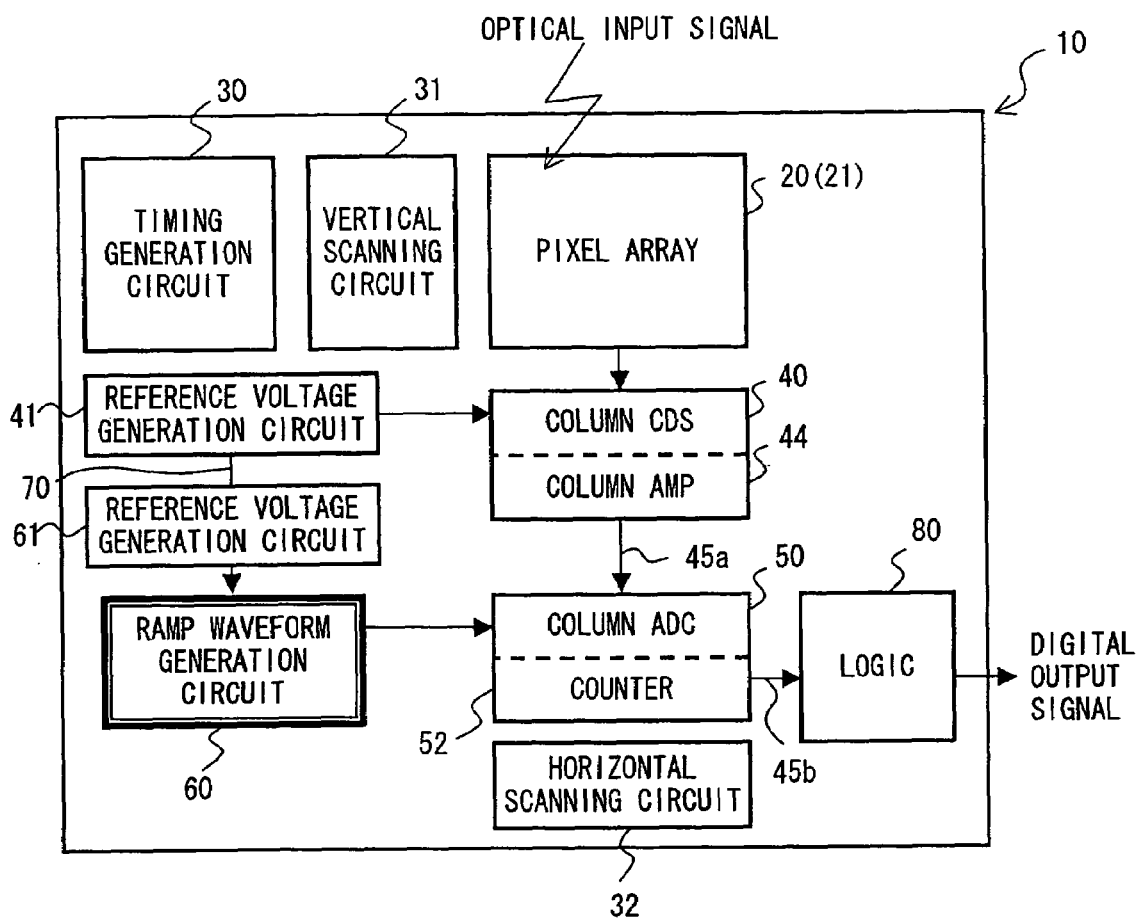
F I G. 2

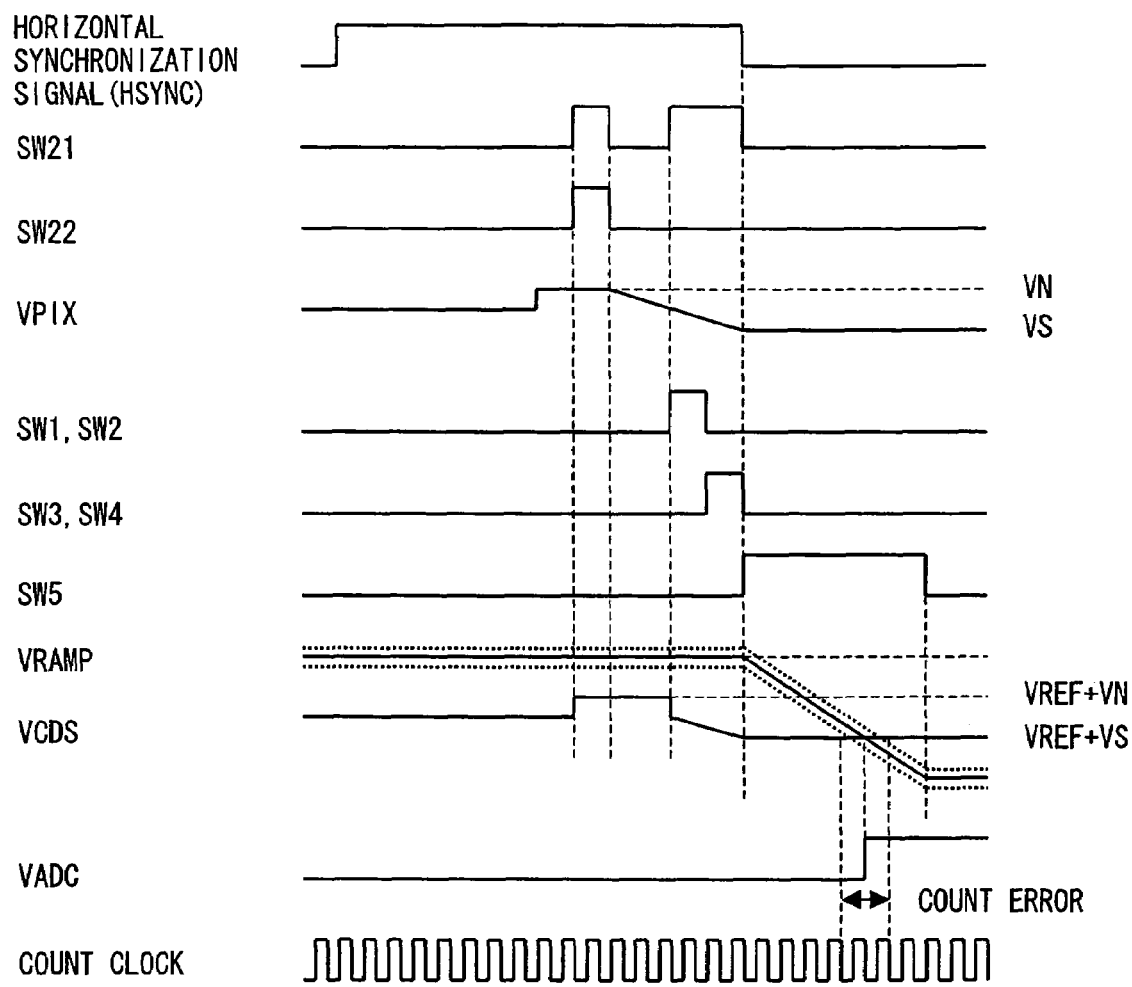
F I G. 3

RAMP WAVEFORM GENERATION CIRCUIT, ANALOG/DIGITAL CONVERSION CIRCUIT, IMAGING DEVICE AND CONTROL METHOD OF IMAGING DEVICE

CROSS-REFERENCE TO RELATED APPLICATIONS

This application is based upon and claims the benefit of priority from the prior Japanese Patent Application No. 2004-197330, filed in Month Jul. 2, 2004, the entire contents of which are incorporated herein by reference.

BACKGROUND OF THE INVENTION

1. Field of the Invention

The present invention relates to a ramp waveform generation device, an analog/digital conversion device, an imaging device and the control method of the imaging device, more particularly to a technology capable of being effectively applied to the digitalization and the like of an optically/electrically converted signal in an imaging device, such as a complementary metal oxide semiconductor (CMOS) image sensor and the like.

2. Description of the Related Art

Attention is focused on a CMOS image sensor since compared with a charge coupled device (CCD) image sensor, the CMOS image sensor is well matched with peripheral image processing circuits in a manufacturing process, operating voltage and the like, and in the CMOS image sensor, an imaging device, an image processing circuit, a controller and the like can be easily integrated on one chip.

Since in this CMOS image sensor, not only an optical/electrical conversion device but a conversion signal can also be amplified at each pixel level, the CMOS image sensor has an advantage of being resistant to noise in the transmission process of an optically/electrically converted signal. However, the CMOS image sensor has fixed pattern noise due to the uneven characteristic of an amplifier at each pixel level, which is a problem.

As the countermeasure, a configuration in which the same number of correlation double sampling (CDS) circuits and analog/digital conversion (ADC) circuits as that of columns are arrayed in parallel for each set of pixels in the column direction of a plurality of pixels two-dimensionally arrayed in the orthogonal row and column directions, that is, a configuration for reducing the fixed pattern noise by a so-called column ADC method, is known.

In this case, a reference voltage generation circuit for a CDS circuit and a reference voltage generation circuit for a ramp waveform generation circuit for inputting a ramp waveform signal to the ADC circuit are separately provided for the following reason.

Specifically, since the output of the reference voltage generation circuit for a CDS circuit gives reference potential to a capacitor device for clamping/sampling the reset noise of a pixel and an optically/electrically converted signal, the reference voltage generation circuit for a CDS circuit must always output a constant voltage. However, since the output of the reference voltage generation circuit for a ramp waveform generation circuit is connected to a large external capacitor device in order to realize a ramp waveform, and its voltage level instantaneously drops when this capacitor device outputs a ramp waveform. Therefore, it is preferable to independently provide each of the CDS circuit and the ramp waveform generation circuit with a reference voltage generation circuit.

By fixing the output potential of the reference voltage generation circuit on the CDS circuit side and initially setting the output potential of the reference voltage generation circuit on the ramp waveform generation circuit side to a prescribed value, the digital conversion accuracy of an optically/electrically converted signal outputted from the CDS circuit using a ramp waveform signal can be maintained.

However, the output potential of the reference voltage generation circuit on the ramp waveform generation circuit side is initially set assuming that the output potential of the reference voltage generation circuit on the CDS circuit side is fixed. Therefore, if the output potential on the CDS circuit side fluctuates for some reason, an error occurs in the AD conversion process, which is another problem.

As to the ramp waveform generation circuit, as disclosed in Patent Reference 1, there is a technology for compensating for the inclination of a ramp waveform due to temperature fluctuations by using a constant-current source composed of an operational amplifier, a transistor, an external resistor with a small temperature coefficient and a current mirror circuit together as a reference power source and charging or discharging a capacity for generating a ramp waveform. However, in this technology, the above-mentioned problem of the ramp waveform generation circuit configured to be connected to both the CDS circuit and the ADS circuit is not recognized at all.

Although Patent Reference 2 discloses a ramp waveform generation circuit composing a DC/DC converter (switching regulator), there is no reference to the above-mentioned problem.

Patent Reference 1: Japanese Patent Application No. 4-48812

Patent Reference 2: Japanese Patent Application No. 11-332222

SUMMARY OF THE INVENTION

It is an object of the present invention to provide a ramp waveform generation circuit capable of realizing highly accurate analog/digital conversion in an analog/digital conversion circuit using a ramp waveform signal.

It is another object of the present invention to provide an analog/digital conversion device capable of realizing highly accurate analog/digital conversion.

It is another object of the present invention to improve the image quality of an imaging device for converting an optically/electrically converted signal from analog to digital, and outputting the signal.

The first aspect of the present invention is a ramp waveform generation circuit which comprises a first reference power supply, and supplies an analog/digital conversion circuit with a ramp waveform signal.

The ramp waveform generation circuit further comprises a connection circuit for reflecting the amount of fluctuation of the output potential of a second reference power supply which is installed in a noise elimination circuit for eliminating the noise of an analog signal inputted to the analog/digital conversion circuit in the output potential of the first reference power supply.

The second aspect of the present invention is an analog/digital conversion device which comprises a comparator to which a ramp waveform signal inputted from the ramp waveform generation circuit, an analog signal inputted through the noise elimination circuit and a clock signal are inputted, and which converts the analog signal into a digital signal, based on the count value of the clock signal, counted until the level of the ramp waveform generation signal coincides with that of the analog signal.

The analog/digital conversion device further comprises a connection circuit for reflecting the amount of fluctuation of the output potential of the second reference power supply installed in the noise elimination circuit in the output potential of the first reference power supply installed in the ramp waveform generation circuit.

The third aspect of the present invention is an imaging device which comprises an optical/electrical conversion device and a reading circuit provided with the noise elimination circuit which is disposed on the output route of an optically/electrically converted signal outputted from the optical/digital conversion device and eliminates the noise of the optically/electrically converted signal and an analog/digital conversion circuit for converting the optically/digitally converted signal after the noise elimination into a digital signal.

The imaging device further comprises a connection circuit for reflecting the amount of fluctuation of the output potential of the second reference power supply installed in the noise elimination circuit in the output potential of the first reference power supply installed in the ramp waveform generation circuit for supplying the analog/digital conversion circuit with a ramp waveform.

The fourth aspect of the present invention is the control method of the imaging device which comprises an optical/electrical conversion device and a reading circuit provided with the noise elimination circuit which is disposed on the output route of an optically/electrically converted signal outputted from the optical/digital conversion device and eliminates the noise of the optically/electrically converted signal and an analog/digital conversion circuit for converting the optically/digitally converted signal after the noise elimination into a digital signal.

The control method comprises a step of temporarily short-circuiting the output line of the first reference power supply installed in the ramp waveform generation circuit for supplying the analog/digital conversion circuit with a ramp waveform and the output line of the second reference power supply installed in the noise elimination circuit and accumulating electrical charge corresponding to the potential difference between the first and second reference power supplies in a capacitor device provided for the output line of the first reference power supply, and a step of outputting a ramp waveform generated by the output potential from the first reference power supply through the capacitor device.

According to the above-mentioned invention, by compensating for the difference in output potential between the first reference power supply of the ramp waveform generation circuit for supplying the analog/digital conversion circuit with a ramp waveform signal and the second reference power supply installed in the noise elimination circuit for eliminating the noise of an analog signal inputted to the analog/digital conversion circuit, for example, the level of the ramp waveform signal which is the reference of analog/digital conversion can be changed in such a way as to follow the fluctuations of the level of an analog input signal which changes in accordance with the fluctuations of the output potential of the second reference power supply, and the highly accurate analog/digital conversion of an analog signal inputted through the noise elimination circuit can be realized without being affected by the fluctuations of the output potential of the second reference power supply installed in the noise elimination circuit.

As described above, by applying the present invention to analog/digital conversion in the optically/electrically converted signal reading circuit of an imaging device, an optically/electrically converted analog signal can be converted into a digital signal with high accuracy, and accordingly, the image quality of the optically/electrically converted signal can be improved.

BRIEF DESCRIPTION OF THE DRAWINGS

FIG. 1 is a circuit diagram showing an internal configuration of the imaging device which is one preferred embodiment of the present invention;

FIG. 2 is a block diagram showing an entire configuration of the imaging device provided with a ramp waveform generation circuit and an analog/digital conversion device each of which is one preferred embodiment of the present invention; and FIG. 3 is a timing chart showing an example of the function of each unit of the imaging device which is one preferred embodiment of the present invention.

DESCRIPTION OF THE PREFERRED EMBODIMENTS

The preferred embodiments of the present invention are described in detail below with reference to the drawings.

FIG. 1 is a circuit diagram showing an internal configuration of the imaging device which is one preferred embodiment of the present invention. FIG. 2 is a block diagram showing an entire configuration of the imaging device provided with a ramp waveform generation circuit and an analog/digital conversion device each of which is one preferred embodiment of the present invention. FIG. 3 is a timing chart showing an example of the function of each unit of the imaging device which is one preferred embodiment of the present invention. This preferred embodiment is described using a case where the present invention is applied to a CMOS image sensor as one example of the imaging device.

As shown in FIG. 2, an imaging device 10 in this preferred embodiment comprises a pixel array 20 in which a plurality of pixel units 21 each composed of an optical/electrical conversion device and an amplifying transistor are two-dimensionally arrayed in the row and column directions, a vertical scanning circuit 31 and a horizontal scanning circuit 32, both for scanning this pixel array 20 and reading picture signals, and a timing generation circuit 30 for controlling the respective operation timing of the vertical scanning circuit 31, the horizontal scanning circuit 32 and a variety of switches, which are described later.

Each pixel unit 21, for example, comprises a photo-diode for converting inputted light into an electrical signal (optically/electrically converted signal) as an optical/electrical conversion device and a transistor for initializing (resetting) the photo-diode, amplifying an optically/electrically converted signal outputted from the photo-diode and so on.

In the pixel array 20, a column CDS circuit 40 for eliminating the noise of an optically/electrically converted signal VPIX (optically/electrically converted signal 45) outputted from the pixel unit 21 in the relevant column, a column ADC circuit 50 for converting an optically/electrically converted signal VCDS after noise elimination and a ramp waveform generation circuit 60 for supplying the column ADC circuit 50 with ramp waveform VRAMP are provided for each column of the plurality pf pixel units 21.

For each of the column CFS circuit 40 and the ramp waveform generation circuit 60, a reference voltage generation circuit 41 and a reference voltage generation circuit 61 are provided.

For the output side of the column ADC circuit 50, a picture signal processing logic 80 for processing an optically/electrically converted signal 45b digitalized in the column ADC circuit 50 and outputting the signal as a picture signal with a prescribed rating, such as YUV, YCbCr, RGB or the like, is provided.

As shown in FIG. 1, the column CDS circuit 40 comprises a reference voltage generation circuit 41, a switch SW21 disposed in series on a route from the pixel unit 21 to the optically/electrically converted signal 45, an amplifier 43, a sample capacitor C22, an amplifier 44, the reference potential output line 42 of the reference voltage generation circuit 41 and a clamp capacitor C21 inserted between the switch 21 and the amplifier 43. Furthermore, the reference potential output line 42 is inserted between the amplifier 44 and the sample capacitor C22 through the switch SW22.

The reference voltage generation circuit 41 of the column CDS circuit 40 comprises a resistor string 41a composed of a plurality of resistor devices arrayed in series between power supply lines VDD and VSS, with a prescribed potential difference and an amplifier 41b for extracting voltage from the reference potential VREF point of the resistor string 41a and outputting the voltage to the reference potential output line 42.

The column CDS circuit 40 eliminates reset noise and the like contained in the optically/electrically converted signal 45 (VPIX) by correlation double sampling using reference potential VREF outputted from the reference voltage generation circuit 41 as a reference and outputs the signal to the column ADC circuit 50 as an optically/electrically converted signal 45a (VCDS).

The ramp waveform generation circuit 60 comprises an amplifier 63, a switch SW4, an amplifier 64, and a ramp capacitor C0 and a constant-current source 65 which are inserted between the amplifier 64 and the switch SW4, which are all arrayed in the reference potential output line 62 from the reference voltage generation circuit 61 in that order.

The reference voltage generation circuit 61 comprises a resistor string 61a composed of a plurality of resistor devices inserted in series between power supply lines VDD and VSS, with a prescribed potential difference and a plurality of potential selection switches 61b for extracting a desired output potential from the resistor string 61a. In this case, the potential selection switch 61b includes a potential selection switch SW2 for extracting a voltage value set to the same value as the reference potential VREF of the reference voltage generation circuit 41 of the above-mentioned column CDS circuit 40 as reference potential VREF' and outputting the value to the reference potential output line 62 and a potential selection switch SW3 for extracting a voltage value higher than the reference potential VREF' and outputting the value to the reference potential output line 62.

In this preferred embodiment, between the reference voltage generation circuit 61 of the ramp waveform generation circuit 60 and the reference voltage generation circuit 41 of the column CDS circuit 40, a connection circuit 70 is provided. This connection circuit 70 is composed of a connection line 71 for connecting input side of the amplifier 63 of the reference potential output line 62 in the ramp waveform generation circuit 60 with the reference potential output line 42 of the reference voltage generation circuit 41 in the column CDS circuit 40, a switch 72 (switch SW1) for controlling the on/off of the connection line 71 and a potential compensation capacitor 73 (potential compensation capacitor C) arrayed between the connection point of the connection line 71 in the reference potential output line 62 and the reference voltage generation circuit 61.

The column ADC circuit 50 comprises a comparator 51 for comparing a ram waveform signal 66 (ramp waveform voltage VRAMP) outputted from the amplifier 64 of the ramp waveform generation circuit 60 with the optically/electrically converted signal 45a (VCDS) outputted from the column CDS circuit 40 and outputting a level "H" as a counter control signal VADC when the respective voltage levels of both the signals coincide with each other, and a counter 52 for counting up count clocks 53 while the counter control signal VADC remains at a level "L", using the counter control signal VADC and a counter clock 53 as input and using the reset of the pixel unit 21 as a trigger, stopping the counting up and also outputting the counter value to the picture signal processing logic 80 as a optically/electrically converted digital signal 45b when the level of the counter control signal VADC becomes "H".

The function of this preferred embodiment is described below with reference to the timing chart shown in FIG. 3.

Firstly, at the time of the initialization of the imaging device 10, the reference potential VREF' of the reference voltage generation circuit 61 is set in such a way as to coincide with the fixed reference potential VREF of the reference voltage generation circuit 41.

Then, the vertical synchronization signal of the vertical scanning circuit 31 selects one row of the pixel array 20, and in this row, one pixel unit 21 in each column position of the relevant line is selected in synchronization with the horizontal synchronization signal (HSYNC) of the horizontal scanning circuit 32. This pixel unit 21 outputs an optically/electrically converted signal level VS with the reset noise VN of the above-mentioned optical/electrical conversion device, in synchronization with the horizontal synchronization signal.

In synchronization with this, firstly, by closing and opening the switches SW21 and SW22 in the timing of reset in the pixel unit 21, the column CDS circuit 40 clamps the reset noise VN on the clamp capacitor C21, using the reference potential VREF of the reference potential output line 42 as a reference, in synchronization with HSYNC. Then, by closing only the switch SW21 in the arrival timing of the optically/electrically converted signal level VS, the sample capacitor C22 stores the optically/electrically converted signal level VS whose reset noise VN is killed, using the reference potential VREF stored in the clamp capacitor C21 as a reference. As soon as the switch SW22 has been opened, the optically/electrically converted signal level VS is outputted to the column ADC circuit 50 through the amplifier 44 as an optically/electrically converted signal 45a.

However, in synchronization with the opening/closing timings of only the switch SW22 in the column CDS circuit 40, the ramp waveform generation circuit 60 firstly opens and closes the switch SW1 of the connection circuit 70 and the potential selection switch SW2 of the reference potential VREF' of the reference voltage generation circuit 61 simultaneously.

By this operation, the potential compensation capacitor C (73) stores the potential difference between the reference potential VREF of the reference voltage generation circuit 41 of the column CDS circuit 40 and the reference potential VREF' (electrical charge corresponding to the potential).

Then, firstly, by closing and opening the potential selection switch SW3 of the reference voltage generation circuit 61 and the switch SW4 in the ramp waveform generation circuit 60, the ramp capacitor C0 stores electrical charge corresponding to a prescribed reference voltage whose potential corresponding to the potential compensation capacitor C (73) has been killed. Then, by closing the switch SW5, the electrical charge of the ramp capacitor C0 flows into the constant-current source 65, the input voltage of the amplifier 64 of the ramp capacitor C0 linearly drops and a ramp waveform signal 66 (ramp waveform voltage VRAMP) is outputted as output.

Then, the comparator 51 of the column ADC circuit 50 outputs the counter control signal VADC in the timing that the level of the ramp waveform signal 66 intersects with that of the optically/electrically converted signal 45a. The counter 52 stops the count-up operation started, using the reset of the pixel unit 21 as a trigger (at the time where the above-mentioned switches SW21 and SW22 are simultaneously closed in the column CDS circuit 40), and outputs a counter value at that time to the picture signal processing logic 80 as an optically/electrically converted digital signal 45b.

In this case, since the level of the optically/electrically converted signal VCDS inputted to the comparator 51 is the sum of the reference potential VREF of the reference voltage generation circuit 41 and the optically/electrically converted signal level VS, the intersection timing of the ramp waveform voltage VRAMP (timing that the level of the counter control signal VADC becomes "H" and the counter 52 is stopped) fluctuates and the same optically/electrically converted signal level VS is converted into a different digital value when the reference potential VREF of the reference voltage generation circuit 41 changes for some reason as time elapses. If this state is left without any process, it becomes an error factor of digital conversion in the column ADC circuit 50.

In this preferred embodiment, as described above, the amount of fluctuation of reference potential VREF due to the reference potential output line 42 of the reference voltage generation circuit 41 can be reduced from the input voltage of the reference potential output line 62 used to generate the ramp waveform VRAM in the ramp waveform generation circuit 60 by the potential compensation capacitor 73 (potential compensation capacitor C) that is provided for the connection circuit 70 inserted between the ramp waveform generation circuit 60 and the column CDS circuit 40. Therefore, as shown by the broken line in FIG. 3, the level of the ramp waveform signal 66 shifts in such a way as to accurately follow the amount of fluctuation that changes with the elapse of time, of the reference potential VREF of the reference voltage generation circuit 41 and to kill the relevant amount of fluctuation. Accordingly, the count error of the counter 52, that is, the digital conversion error of an optically/electrically converted signal VCDS in the column ADC circuit 50 is prevented from occurring.

As a result, the quality degradation of an image outputted from the picture signal processing logic 80 due to the uneven digital conversion level of luminance (optically/electrically converted digital signal 45a) detected in each pixel unit 21 of the pixel array 20 or the like is surely prevented. Specifically, for example, an image outputted from the picture signal processing logic 80 is prevented from taking a striped pattern, an unevenly colored image is prevented from occurring and so on. Thus, a high-quality image can be photographed.

The present invention is not limited to the above-mentioned preferred embodiments, and any variations and any modifications can be possible as long as the subject matter of the present invention is not deviated.

For example, although in the above description, the present invention has been applied to a column CDS circuit, a column ADC circuit, a ramp waveform generation circuit or the like in a CMOS image sensor, the present invention can also applied to general devices for performing analog/digital conversion.

According to the present invention, a ramp waveform generation circuit capable of performing highly accurate analog/digital conversion in an analog/digital conversion circuit using a ramp waveform signal can be provided.

An analog/digital conversion device capable of realizing highly accurate analog/digital conversion can also be provided.

The image quality of an imaging device for converting an optically/electrically converted signal from analog to digital and outputting the signal can be improved.

What is claimed is:

1. A ramp waveform generation circuit which comprises a first reference power supply and supplies an analog/digital conversion circuit with a ramp waveform signal, further comprising
a connection circuit for reflecting an amount of fluctuation of an output potential of a second reference power supply which is installed in a noise elimination circuit for eliminating the noise of an analog signal inputted to the analog/digital conversion circuit in an output potential of the first reference power supply.

2. The ramp waveform generation circuit according to claim 1, wherein
said connection circuit includes a connection line for short-circuiting an output line of the first reference power supply and an output line of the second reference power supply through a switch, and a capacitor device provided on an upper stream side of a connection point of a connection line in the output line of the first reference power supply.

3. The ramp waveform generation circuit according to claim 1, wherein
the analog/digital conversion circuit comprises a comparator to which a ramp waveform signal inputted from the ramp waveform generation circuit, an analog signal inputted through the noise elimination circuit and a clock signal are inputted, and which converts the analog signal into a digital signal, based on a count value of the clock signal, needed until a level of a ramp waveform generation signal reaches that of the analog signal.

4. The ramp waveform generation circuit according to claim 1, wherein
the first reference power supply includes a resistor string for variably setting an output potential.

5. The ramp waveform generation circuit according to claim 1, wherein
the analog signal is composed of optically/electrically converted signals outputted from an optical/electrical conversion device of an imaging device, and
the noise elimination circuit is composed of a plurality of correlation double sampling circuits for eliminating the noise of an optically/electrically converted signal, based on the output potential of the second reference power supply.

6. The ramp waveform generation circuit according to claim 1, wherein
the analog/digital conversion circuit is provided for each row or column of a plurality of optical/electrical conversion devices in an imaging device in which the plurality of optical/electrical conversion devices are two-dimensionally arrayed in the row and column directions, and digitalizes optically/electrically converted signals outputted from each of the optical/electrical conversion devices.

7. An analog/digital conversion device which comprises a comparator to which a ramp waveform signal inputted from a ramp waveform generation circuit, an analog signal inputted through a noise elimination circuit and a clock signal are inputted, and which converts the analog signal into a digital signal, based on a count value of the clock signal, needed until a level of the ramp waveform generation signal reaches that of the analog signal, further comprising:
a connection circuit for reflecting amount of fluctuation of an output potential of a second reference power supply which is installed in the noise elimination circuit to an output potential of a first reference power supply which is installed in the ramp waveform generation circuit.

8. The analog/digital conversion device according to claim 7, wherein
said connection circuit includes a connection line for short-circuiting an output line of the first reference power supply and an output line of the second reference power supply through a switch, and a capacitor device provided on the upper stream side of a connection point of a connection line in the output line of the first reference power supply.

9. The analog/digital conversion device according to claim 7, wherein
the first reference power supply includes a resistor string for variably setting the output potential.

10. The analog/digital conversion device according to claim 7, wherein
the analog signal is composed of optically/electrically converted signals outputted from an optical/electrical conversion device of an imaging device, and the noise elimination circuit is composed of a plurality of correlation double sampling circuits for eliminating the noise of the optically/electrically converted signal, based on the output potential of the second reference power supply.

11. The analog/digital conversion device according to claim 7, wherein
the analog/digital conversion circuit is provided for each row or column of a plurality of optical/electrical conversion devices in an imaging device in which the plurality of optical/electrical conversion devices are two-dimensionally arrayed in the row and column directions, and digitalizes optically/electrically converted signals outputted from each of the optical/electrical conversion devices.

12. An imaging device which comprises an optical/electrical conversion device and a reading circuit provided with a noise elimination circuit which is disposed on an output route of an optically/electrically converted signal outputted from the analog/digital conversion device and eliminates a noise of the optically/electrically converted signal and the analog/digital conversion circuit for converting the optically/electrically converted signal after noise elimination into a digital signal, further comprising
a connection circuit for reflecting an amount of fluctuation of an output potential of the second reference power supply installed in the noise elimination circuit in an output potential of a first reference power supply installed in a ramp waveform generation circuit.

13. The imaging device according to claim 12, wherein
said connection circuit includes a connection line for short-circuiting an output line of the first reference power supply and an output line of the second reference power supply through a switch, and a capacitor device provided on an upper stream side of a connection point of a connection line in the output line of the first reference power supply.

14. The imaging device according to claim 12, wherein
the noise elimination circuit is composed of correlation double sampling circuits for eliminating the noise of the optically/electrically converted signal, based on the output potential of the second reference power supply.

15. The imaging device according to claim 12, wherein
the analog/digital conversion circuit comprises a comparator to which a ramp waveform signal inputted from a ramp waveform generation circuit, an analog signal inputted through the noise elimination circuit and a clock signal are inputted, and which converts the analog signal into a digital signal, based on a count value of the clock signal, needed until a level of the ramp waveform generation signal reaches that of the analog signal.

16. The imaging device according to claim 12, wherein
the first reference power supply includes a resistor string for variably setting the output potential.

17. The imaging device according to claim 12, wherein
the reading circuit is provided for each row or column of a plurality of optical/electrical conversion devices which are two-dimensionally arrayed in the row and column directions.

18. A control method of an imaging device which comprises an optical/electrical conversion device and a reading circuit provided with a noise elimination circuit which is disposed on an output route of an optically/electrically converted signal outputted from the analog/digital conversion device and eliminates a noise of the optically/electrically converted signal and the analog/digital conversion circuit for converting the optically/electrically converted signal after the noise elimination into a digital signal, comprising:
temporarily short-circuiting the output line of a first reference power supply installed in a ramp waveform generation circuit for supplying the analog/digital conversion circuit with a ramp waveform and an output line of a second reference power supply installed in the noise elimination circuit and accumulating electrical charge corresponding to a potential difference between the first and second reference power supplies in a capacitor device provided for the output line of the first reference power supply; and
outputting a ramp waveform signal generated by the output potential from the first reference power supply through the capacitor device.

* * * * *